United States Patent
Salman et al.

(10) Patent No.: US 7,791,102 B2
(45) Date of Patent: Sep. 7, 2010

(54) ELECTROSTATIC DISCHARGE PROTECTION DEVICES AND METHODS FOR PROTECTING SEMICONDUCTOR DEVICES AGAINST ELECTROSTATIC DISCHARGE EVENTS

(75) Inventors: Akram Salman, Santa Clara, CA (US); Stephen Beebe, Los Altos, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 386 days.

(21) Appl. No.: 11/549,923

(22) Filed: Oct. 16, 2006

(65) Prior Publication Data
US 2008/0087962 A1 Apr. 17, 2008

(51) Int. Cl.
*H01L 27/07* (2006.01)

(52) U.S. Cl. .................. 257/173; 257/174; 257/175; 257/355; 257/E27.03

(58) Field of Classification Search .............. 257/175, 257/174, 173, 355, E27.03
See application file for complete search history.

(56) References Cited

U.S. PATENT DOCUMENTS

| | | | |
|---|---|---|---|
| 5,637,900 | A | 6/1997 | Ker et al. |
| 6,274,910 | B1* | 8/2001 | Yu .................. 257/355 |
| 6,594,132 | B1 | 7/2003 | Avery |
| 6,737,582 | B2 | 5/2004 | Yu |
| 6,737,682 | B1 | 5/2004 | Yu et al. |
| 6,768,619 | B2 | 7/2004 | Ker et al. |
| 7,560,777 | B1* | 7/2009 | Salman et al. .......... 257/355 |
| 2002/0122280 | A1 | 9/2002 | Ker et al. |
| 2003/0007301 | A1 | 1/2003 | Ker |
| 2007/0012945 | A1 | 1/2007 | Sugizaki |
| 2007/0018193 | A1* | 1/2007 | Ker et al. .................. 257/119 |
| 2007/0040221 | A1 | 2/2007 | Gossner |
| 2007/0170512 | A1 | 7/2007 | Gauthier, Jr. et al. |
| 2007/0262386 | A1 | 11/2007 | Gossner et al. |
| 2007/0267700 | A1 | 11/2007 | Russ et al. |

FOREIGN PATENT DOCUMENTS

DE  102006055105 A1  11/2007
EP  0852400 A  8/1998

OTHER PUBLICATIONS

International Search Report for International Application No. PCT/US2007/020594 mailed Feb. 7, 2008.
Farshid Raissi, A Brief Analysis of the Field Effect Diode and Breakdown Transistor, IEEE Transactions on Electron Devices, vol. 43, No. 2, Feb. 1996, pp. 362-365.

(Continued)

*Primary Examiner*—Victor A Mandala
(74) *Attorney, Agent, or Firm*—Ingrassia Fisher & Lorenz, P.C.

(57) ABSTRACT

Methods and devices are provided for protecting semiconductor devices against electrostatic discharge events. An electrostatic discharge protection device comprises a silicon substrate, a $P^+$-type anode region disposed within the silicon substrate, and an N-well device region disposed within the silicon substrate in series with the $P^+$-type anode region. A first P-well device region is disposed within the silicon substrate in series with the first N-well device region and an $N^+$-type cathode region is disposed within the silicon substrate. A gate electrode is disposed at least substantially overlying the first N-well and P-well device regions of the silicon substrate.

15 Claims, 4 Drawing Sheets

OTHER PUBLICATIONS

Voldman et al., Electrostatic Discharge (ESD) Protection in Silicon-on-Insulator (SOI) CMOS Technology with Aluminum and Copper Interconnects in Advanced Microprocessor Semiconductor Chips, EOS/ESD Symposium, 1999, pp. 105-115.

Tang et al., Novel Diode Structures and ESD Protection Circuits in a 1.8-V 0.15-um Partially-Depleted SOI Salicided CMOS Process, Proceedings of 8th IPFA, 2001, pp. 91-96, Singapore.

Gopalakrishnan et al., I-MOS: A Novel Semiconductor Device with a Subthreshold Slope Lower than kT/q, IEDM, 2002, pp. 289-292.

PCT International Search Report for International Application No. PCT/US08/007975; Dated Sep. 1, 2008.

German Offie Action for 11 2007 002466.6 prepared by the German Patent Office on Nov. 19, 2009.

Chinese Office Action for 200780041846.8 mailed Apr. 26, 2010.

* cited by examiner

ELECTROSTATIC DISCHARGE PROTECTION DEVICES AND METHODS FOR PROTECTING SEMICONDUCTOR DEVICES AGAINST ELECTROSTATIC DISCHARGE EVENTS

FIELD OF THE INVENTION

The present invention generally relates to semiconductor devices, and more particularly relates to electrostatic discharge protection devices and methods for protecting an input of a semiconductor structure from an electrostatic discharge event.

BACKGROUND OF THE INVENTION

As semiconductor technology advances beyond 130 nm and 90 nm technology towards 65 nm, 45 nm, 32 nm, and even beyond, the electrostatic discharge (ESD) protection for input/output (I/O) pads and supply clamps becomes more challenging. This is especially true for silicon-on-insulator (SOI) technology, which is expected to be preferable over bulk technology for the new process nodes. An ESD event refers to a phenomenon of electrical discharge of a current (positive or negative) for a short duration during which a large amount of current is provided to a semiconductor structure.

Present-day ESD protection circuits present a number of drawbacks, particularly when used with SOI technology. Some ESD protection circuits suffer from high leakage current and high capacitive loading. Other ESD protection circuits, such as those on SOI substrates, may exhibit lower leakage current and lower capacitive loading, but require thin SOI films that limit the device's ESD capability due to high self-heating, which, in turn, lowers the failure current under ESD stress.

Accordingly, it is desirable to provide an ESD protection device that exhibits low leakage and low capacitive loading. It also is desirable to provide an ESD protection device that enables a reduction in size of the device. In addition, it is desirable to provide a method for protecting a semiconductor structure from an ESD event using an improved ESD protection device. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

In accordance with an exemplary embodiment of the present invention, an electrostatic discharge protection device is provided. The electrostatic discharge protection device comprises a silicon substrate, a $P^+$-type anode region disposed within the silicon substrate, and an N-well device region disposed within the silicon substrate in series with the $P^+$-type anode region. A P-well device region is disposed within the silicon substrate in series with the N-well device region and an $N^+$-type cathode region is disposed within the silicon substrate. A gate electrode is disposed at least substantially overlying the N-well and P-well device regions of the silicon substrate.

In accordance with another exemplary embodiment of the present invention, a method for protecting an input of a semiconductor structure from an electrostatic discharge event is provided. The method comprises the steps of providing a first diode and a second diode series-coupled to an input, forward biasing the first diode and the second diode, and shorting out the first diode or the second diode in the event of an electrostatic discharge event.

In accordance with a further exemplary embodiment of the present invention, a method for protecting a semiconductor structure from an electrostatic discharge event is provided. The method comprises the step of providing a first diode and a second diode series-coupled to an input. The first diode and the second diode are in electrical communication with an overlying gate. An electrostatic discharge event is sensed at the gate and a device region of the first diode or the second diode is inverted.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
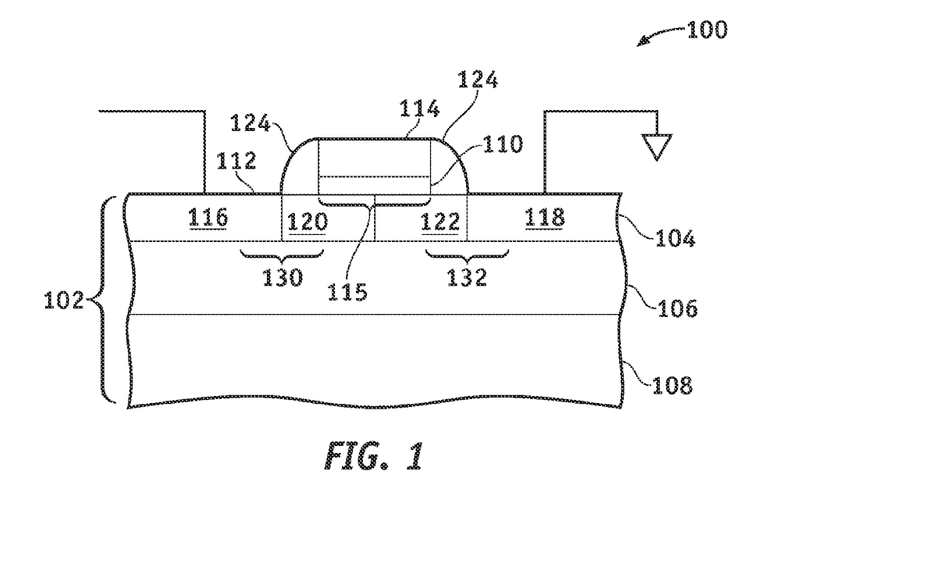
FIG. 1 is a cross-sectional view of an ESD protection device in accordance with an exemplary embodiment of the present invention.

Referring to FIG. 1, an electrostatic discharge (ESD) protection device 100 in accordance with an exemplary embodiment of the present invention comprises a dual-well field effect diode (DW-FED) used for the protection of a core semiconductor circuit (not shown) against an ESD event. ESD protection device 100 comprises a silicon substrate, which may be a bulk silicon wafer (not illustrated) or, preferably, may be a thin layer of silicon 104 on an insulating layer 106 (commonly know as silicon-on-insulator or SOI) that, in turn, is supported by a carrier wafer 108. Thin silicon layer 104 typically has a thickness of about 20-100 nanometers (nm) depending on the circuit function being implemented, and preferably has a thickness of less than about 80 nm.

The ESD protection device 100 further comprises a $P^+$-type anode region 116 and an $N^+$-type cathode region 118, both disposed in the silicon layer 104. The $P^+$-type anode region 116 of silicon layer 104 is separated from the $N^+$-type cathode region 118 by an N-well device region 120 and a P-well device region 122. The $P^+$-type and $N^+$-type regions are regions having a doping concentration greater than the doping concentration of the P-well and N-well regions. In an exemplary embodiment of the invention, the P-well and N-well device regions may be doped with a suitable dopant to a concentration of about $5 \times 10^{17}$ to about $5 \times 10^{18}$ cm$^{-3}$, while the P$^+$-type anode region and the N$^+$-type cathode region may be doped with a suitable dopant to a concentration of about $10^{21}$ to about $10^{22}$ cm$^{-3}$. The P$^+$-type anode region and the N$^+$-type cathode region and the P-well and N-well regions can be fabricated in the standard manner, for example, by ion implantation of arsenic or phosphorous for the N-type areas and boron for the P-type areas. The doping of the wells determines the turn-on voltage of ESD protection device 100.

A layer of gate insulator 110 is disposed on a surface 112 of silicon layer 104. The gate insulator may be thermally grown silicon dioxide formed by heating the silicon substrate in an oxidizing ambient, or may be a deposited insulator such as a silicon oxide, silicon nitride, a high dielectric constant insulator such as HfSiO, or the like. Deposited insulators can be deposited, for example, in known manner by chemical vapor deposition (CVD), low pressure chemical vapor deposition (LPCVD), semi-atmospheric chemical vapor deposition (SACVD), or plasma enhanced chemical vapor deposition (PECVD). The gate insulator material is typically 1-10 nm in thickness. In accordance with one embodiment of the invention, a gate electrode 114 formed of gate electrode-forming material, preferably polycrystalline silicon, is deposited onto the layer of gate insulator. Other electrically conductive gate electrode-forming materials, such as metals and metal silicides, may also be deposited. The gate electrode-forming material hereinafter will be referred to as polycrystalline silicon although those of skill in the art will recognize that other materials can also be employed. If the gate electrode-forming material is polycrystalline silicon, that material is typically deposited to a thickness of about 50-200 nm and preferably to a thickness of about 100 nm by LPCVD by the hydrogen reduction of silane. The layer of polycrystalline silicon is preferably deposited as undoped polycrystalline silicon and is subsequently impurity doped by ion implantation. The ESD protection device 100 further comprises sidewall spacers 124, which are used to define regions 116 and 118. Sidewall spacers 124 may be formed of any suitable dielectric material that has an etch characteristic different from that of the gate electrode-forming material of gate electrode 114 when exposed to the same etch chemistry. For example, sidewall spacers 124 may be formed of silicon nitride, silicon oxide, or silicon oxynitride.

As evident from FIG. 1, ESD protection device 100 has two P-N junctions in series within silicon layer 104, thus forming two forward-biased diodes 130 and 132 in series. The gate electrode 114 can be biased by an external circuit, tied to an external supply $V_{DD}$ or $V_{SS}$, or left floating. If the gate electrode is grounded or biased slightly negative or slightly positive with respect to ground, only a depletion of a channel 115 under the gate electrode will occur. Accordingly, in non-ESD operation, device 100 will behave as two forward-biased diodes in series having a turn-on voltage of about 1.4 volts (0.7 volts for each of the diodes). The turn-on voltage of device 100 is thus higher than the expected normal operating voltage of the core circuit that is being protected so device 100 effectively appears as an open circuit that is invisible to the core circuit to be protected. In addition, because two diodes are used in series, the series combination has a capacitance lower than that of a single protection diode. If the gate electrode is tied to a high positive voltage, such as that resulting from a positive ESD event (or is left floating during such an event), the device 100 behaves as a single diode because the voltage on the gate will invert the channel in the P-well beneath the gate electrode 114. If the gate electrode is tied to a high negative voltage such as that resulting from a negative ESD event, the device 100 also behaves as a single diode because the voltage on the gate will invert the surface of the N-well causing a P-type channel to form. Accordingly, during an ESD event one of the diodes of device 100 is shorted out by the channel that is formed, the turn-on voltage of device 100 will be reduced to about 0.7 volts, and device 100 serves as a short circuit, thus shorting the ESD event to ground and protecting the core circuit.

Figure 2:
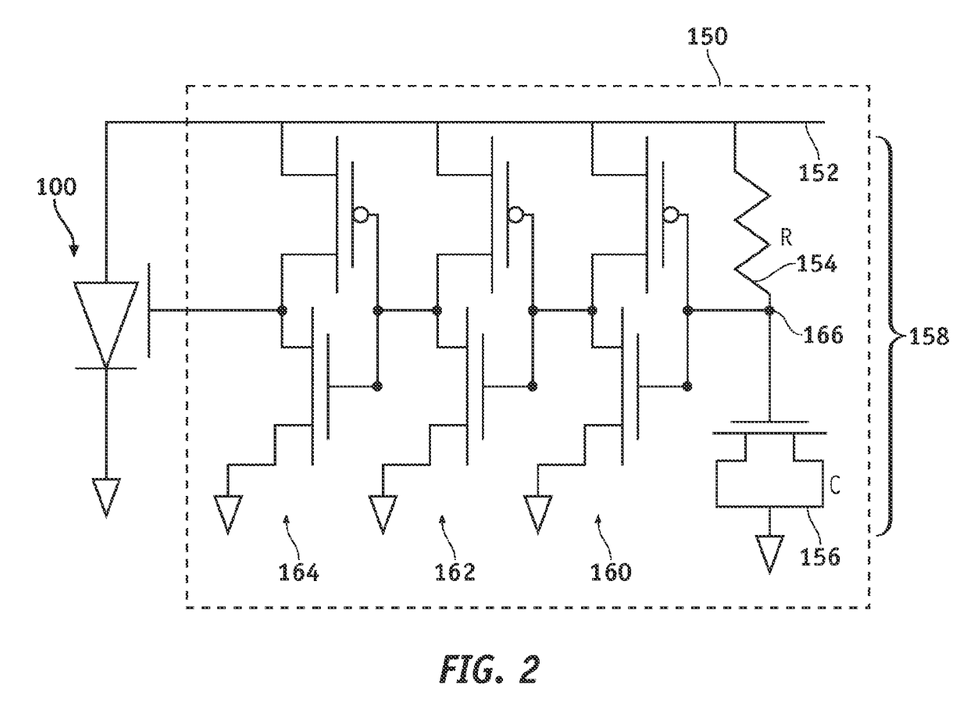
FIG. 2 is a schematic circuit diagram of the ESD protection device of FIG. 1 used with an RC-triggered sensing circuit.

ESD protection device 100 can be used with a sensing circuit to control the voltage of gate electrode 114 and thus to change the gate bias based on the presence or absence of an ESD event. FIG. 2 illustrates an RC-triggered sensing circuit 150 electrically coupled to the gate electrode of ESD protection device 100. Sensing circuit 150 operates on the premise that ESD events have a rapid rise time. Sensing circuit 150 is coupled to an external voltage supply $V_{DD}$ 152 and comprises an RC trigger 158 formed of a resistor 154 and capacitor 156. In an exemplary embodiment of the invention, RC trigger 158 has an RC time constant of about 0.1 to about 0.2 µs, which is slow in comparison to the expected rise time of an ESD event. For example, in accordance with an exemplary embodiment of the invention, the resistor 154 has a resistance in the range of about 50K to 100K ohms and the capacitor 156 has a capacitance in the range of about 1 pF to about 10 pF. Sensing circuit 150 further comprises a first inverter 160, a second inverter 162, and a third inverter 164 coupled to RC trigger 158 as shown. Each inverter is formed of a P-channel transistor (PMOS) and an N-channel transistor (NMOS).

During normal operation, in the absence of an ESD event, an activation signal at a node 166 appears as a logical 1 and the inverters invert the signal to a logical 0 that is applied to the gate of ESD protection device 100. The logical 0 does not invert the surface of either the N-well or the P-well. Thus, ESD protection device 100 behaves as two diodes in series, or effectively as an open circuit. In contrast, when an ESD event occurs at $V_{DD}$ 152, the ESD event has a very short rise time and thus the activation signal at node 166 appears as a logical 0 because of the slow response time of the RC trigger. The inverters invert the signal to a logical 1 which is applied to the gate of ESD device 100. As described above, when the voltage at gate electrode 114 of ESD protection device 100 is high, device 100 behaves as a single diode because the gate will invert the P-well forming a channel beneath the gate. Accordingly, the on-voltage of device 100 is reduced and device 100 effectively appears as a short circuit, thus shorting the ESD event to ground and protecting the core circuit.

Figure 3:
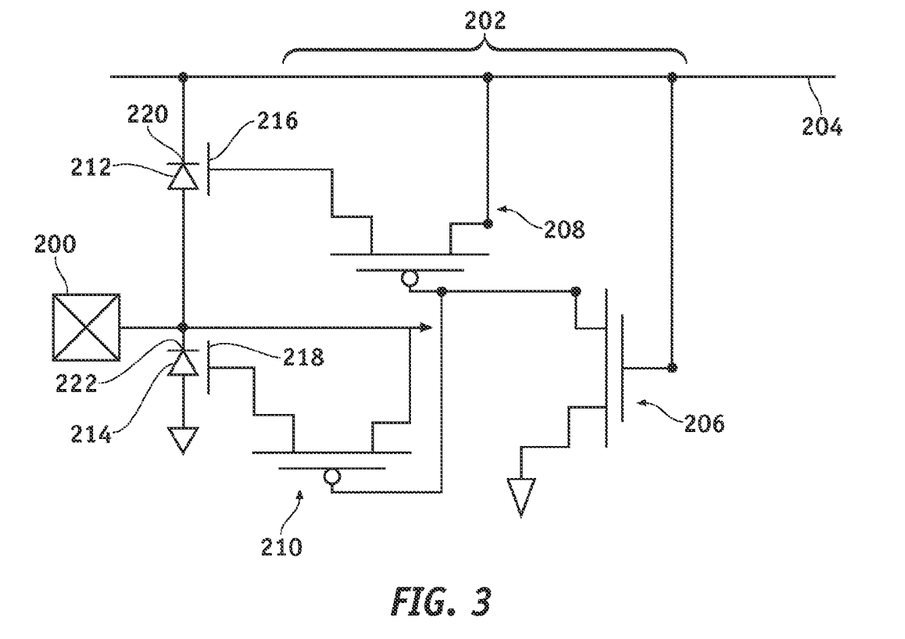
FIG. 3 is a schematic circuit diagram of the ESD protection device of FIG. 1 used with a high speed input/output pad.

Because of the inherently lower capacitance of ESD protection device 100 (due to the existence of two P-N junctions in series), the dual-well ESD protection device can be used with high speed I/O pads. Referring to FIG. 3, in accordance with an exemplary embodiment of the present invention, two ESD protection devices 212 and 214 are coupled to a high speed I/O pad 200 along with a biasing circuit 202 that ensures that the gates of devices 212 and 214 have a low turn-on voltage under an ESD event. The biasing circuit is coupled to an external voltage supply $V_{DD}$ 204 and comprises an N-channel transistor 206 and two P-channel transistors 208 and 210, as shown. The two ESD protection devices 212 and 214 are dual-well field effect diodes, such as dual-well ESD protection device 100 of FIG. 1. First ESD protection device 212 is coupled to $V_{DD}$ 204 and I/O pad 200. Second ESD protection device 214 is coupled to I/O pad 200 and ground or $V_{SS}$.

During normal operation in the absence of an ESD event, NMOS 206 will be turned on, which couples the gates of PMOS 208 and PMOS 210 to a low voltage, turning both PMOS transistors on so they effectively appear as short circuits. Accordingly, gates 216 and 218 of ESD protection devices 212 and 214 will be tied to their cathodes 220 and 222, respectively, and each of the protection devices 212 and 214 will have a high turn-on voltage. Because the voltage at I/O pad 200 does not rise above $V_{DD}$ 204, device 212 is reverse biased or zero biased and device 214 is reverse biased. Thus, ESD protection devices 212 and 214 behave as two diodes in series, they exhibit low leakage, and the circuit appears as an open circuit that is transparent to the core circuit. In addition, because the devices behave as two diodes in series, they collectively exhibit low capacitance.

In contrast, when a positive ESD event occurs at I/O pad 200, which typically occurs when the device is not operating and $V_{DD}$ 204 is essentially at ground or floating, NMOS 206 is off and the gates of PMOS 208 and PMOS 210 are floating. Gate 216 of device 212 is floating, the anode is positive, and, referring again to FIG. 1, diode 132 is shorted out by the channel formed across P-well region 122, thus causing device 212 to behave as one diode and to have a low turn-on voltage.

Referring back to FIG. 3, when a negative ESD event occurs at I/O pad 200, which again typically occurs when the device is not operating and $V_{DD}$ 204 is essentially at ground or floating, NMOS 206 is off and the gates of PMOS 208 and PMOS 210 are floating. The gate 218 of device 214 is capacitively coupled to its anode 222, which is coupled to the voltage of I/O pad 200, and voltage at the gate 218 appears low. Referring again briefly to FIG. 1, a low voltage on gate electrode 114 will short out diode 130 of FIG. 1 by inverting the channel across the N-well 120. Accordingly, ESD protection device 214 behaves as one diode, has a low turn-on voltage, and the negative ESD event is shunted to ground.

Figure 4:
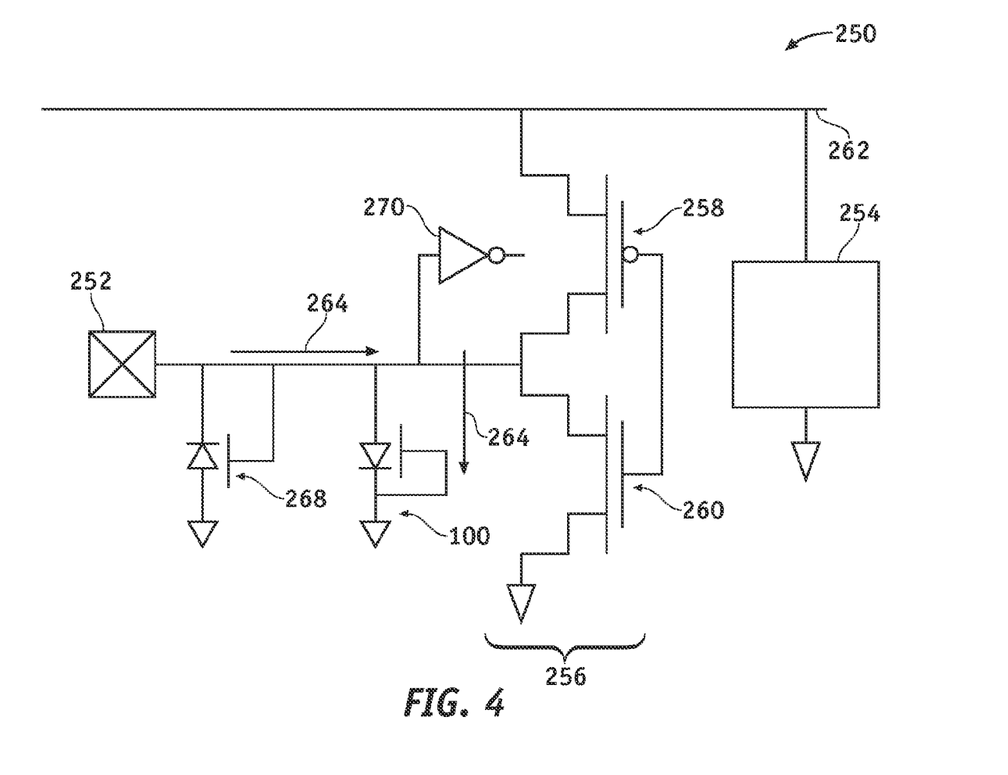
FIG. 4 is a schematic circuit diagram of the ESD protection device of FIG. 1 used with a local clamping circuit.

Because of its higher turn-on voltage during normal operation, ESD protection device 100 can also be used for local clamping. FIG. 4 illustrates a local clamping circuit 250, in accordance with an exemplary embodiment, that utilizes both ESD protection device 100 and a diode device 268 to locally clamp the pad to ground. Diode device 268 can be a dual-well field effect diode such as ESD protection device 100 or can be a conventional diode. ESD protection device 100 and diode device 268 are coupled to an I/O pad 252 along with a supply clamp or decoupling capacitor 254. Circuit 256 illustrates core circuitry that may comprise, for example, two NMOS transistors 258 and 260 of an output driver coupled to an external supply voltage $V_{DD}$ 262 and I/O pad 252. An input receiver device 270 represents input circuitry coupled to I/O pad 252.

When a positive ESD event occurs at I/O pad 252, reverse-biased diode device 268 appears as an open circuit. Referring again to FIG. 1, the high positive voltage on gate electrode 114 will short out diode 132 of device 100 by inverting the channel across the P-well 122. Accordingly, referring back to FIG. 4, ESD protection device 100 behaves as a single forward-biased diode and the positive ESD event is shunted to ground, as illustrated by arrows 264. This in turn will lower the pad voltage. This phenomenon can be represented as follows:

$$V_{pad} = V_{ESD100} + IR_{ESD100},$$

where I is the current through ESD protection device 100, $V_{pad}$ is the pad voltage, $V_{ESD100}$ is the turn-on voltage of ESD protection device 100, and $R_{ESD100}$ is the series resistance of ESD protection device. When a negative ESD event occurs at I/O pad 252, the forward-biased ESD protection device 100 behaves as an open circuit and diode device 268 behaves as a short circuit and the ESD pulse is shunted to ground.

Figure 5:
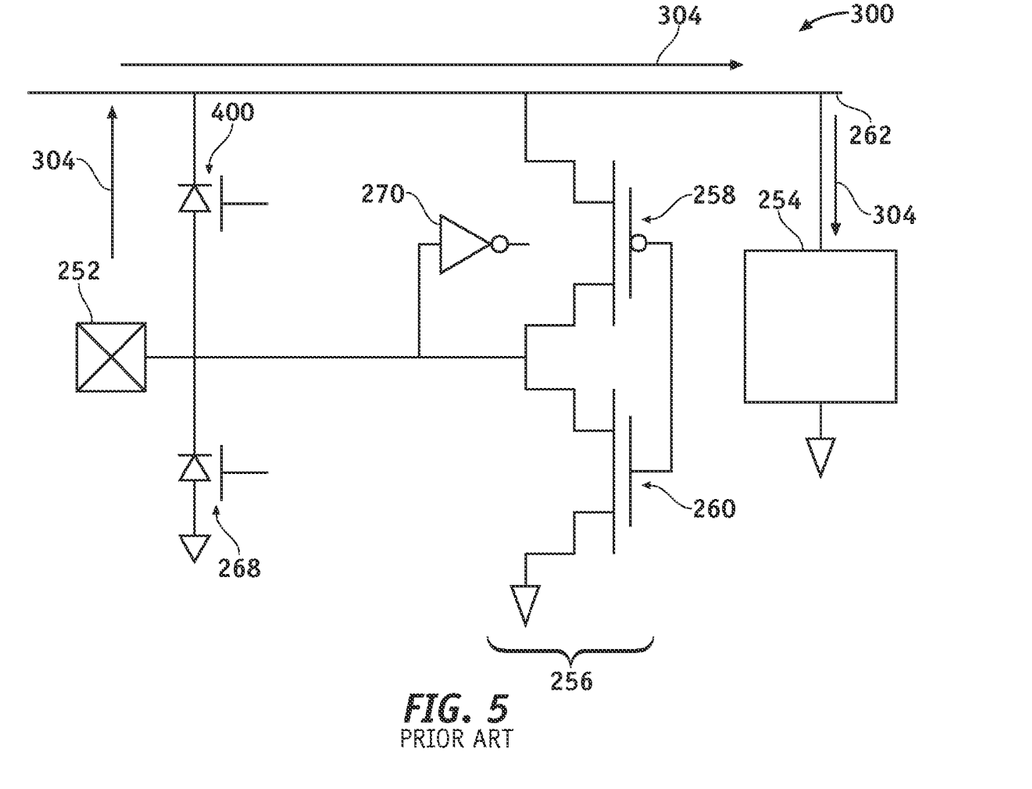
FIG. 5 is a schematic circuit diagram of a prior art ESD protection device used with a rail-based clamping circuit.
Figure 7:
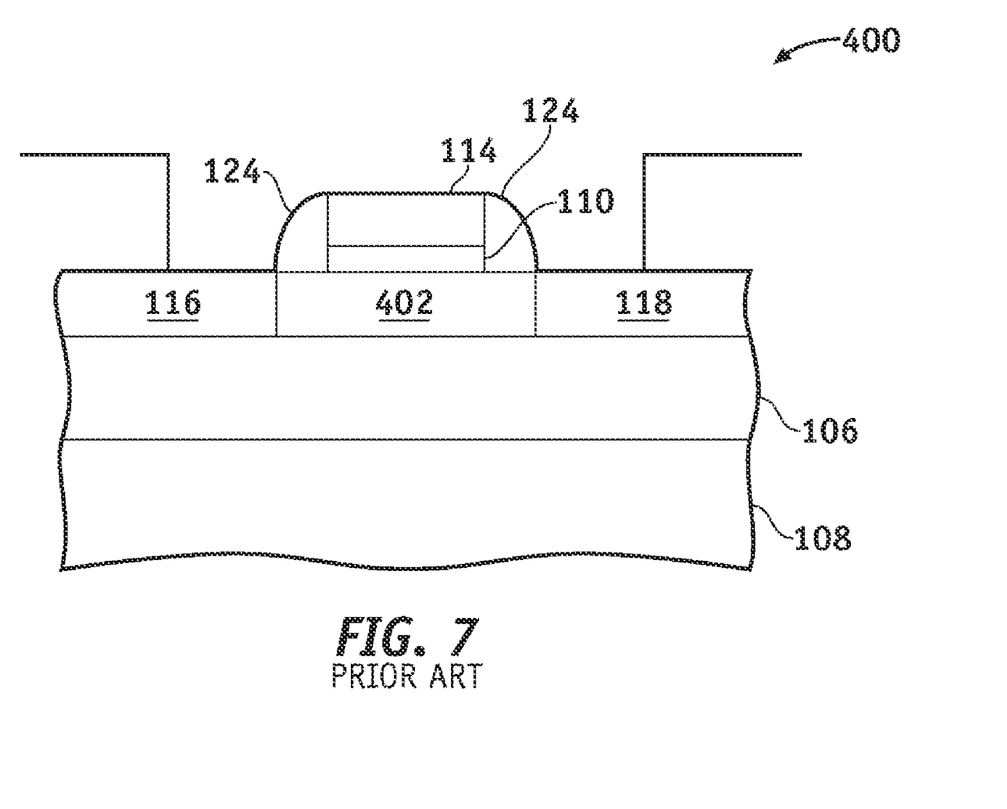
FIG. 7 is a cross-sectional view of a prior art ESD protection device.

The use of ESD protection device 100 in a local clamping circuit, such as clamping circuit 250, overcomes some of the challenges with the use of prior art protection devices. Referring to FIG. 7, an example of a prior art ESD protection device that has been used in local clamping circuits for ESD protection includes a single "N-body" or "P-body" device 400. Single-well device 400 is similar to dual-well field effect diode 100 but the $P^+$-type anode region 116 and the $N^+$-type cathode region 118 are separated by only one well 402 disposed underlying the gate electrode 114. The N-body or P-body is formed of the same low-dose implant used by standard PMOS or NMOS transistors, respectively, in the technology. FIG. 5 illustrates a prior art ESD device, such as single-well device 400, used in a rail-based clamping circuit 300. Rail-based clamping circuit 300 is the same as local clamping circuit 250 except that, instead of using dual-well ESD protection device 100 coupled between I/O pad 252 and ground, a single well device 400 is coupled between I/O pad 252 and external supply $V_{DD}$ 262. When a negative ESD event occurs at I/O pad, the ESD pulse is shunted to ground through diode device 268 as described above. However, when a positive ESD event occurs at I/O pad 252, the signal from the pad will travel through the prior art ESD device 400 to $V_{DD}$ 262, then through the supply clamp or decoupling capacitance 254 to ground, as illustrated by arrows 304. In this regard, the voltage on the pad, $V_{pad}$, is significantly higher than the $V_{pad}$ that occurs in clamping circuit 250 when a positive ESD event occurs at the pad. This voltage can be represented as follows:

$$V_{pad} = V_{diode} + IR_{diode} + IR_{VDD} + V_{clamp} + IR_{clamp},$$

where I is the current through ESD 400, $V_{pad}$ is the pad voltage, $V_{diode}$ is the turn-on voltage of ESD 400, $R_{diode}$ is the series resistance of ESD 400, $V_{clamp}$ is the supply clamp turn-on voltage, and $R_{clamp}$ is the supply clamp series resistance. If voltage $V_{pad}$ is higher than the turn-on voltage of transistor 260 of driver circuit 256, it may result in a breakdown of transistor 260.

Figure 6:
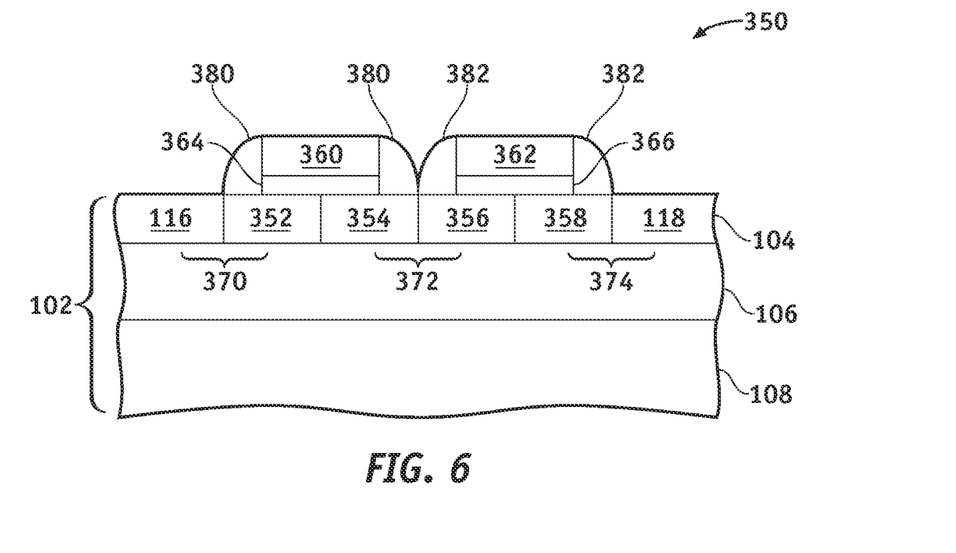
FIG. 6 is a cross-sectional view of an ESD protection device in accordance with another exemplary embodiment of the present invention.

FIG. 6 illustrates an ESD protection device 350 in accordance with another exemplary embodiment of the present invention. ESD protection device 350 is similar to ESD protection device 100 as ESD protection device 350 comprises a silicon substrate 102, which can be a bulk silicon substrate or formed of a thin layer of silicon 104 and an insulating layer 106 (commonly know as silicon-on-insulator or SOI) that, in turn, is supported by a carrier wafer 108. The ESD protection device 350 further comprises a $P^+$-type anode region 116 and an $N^+$-type cathode region 118, both disposed in the silicon layer 104. The $P^+$-type anode region 116 of silicon layer 104 is separated from the $N^+$-type cathode region 118 by a first N-well device region 352, a first P-well device region 354, a second N-well device region 356, and a second P-well device region 358. The $P^+$-type and $N^+$-type regions are regions having a doping concentration greater than the doping concentration of the P-well and N-well regions. For example, in an exemplary embodiment of the invention, the P-well and N-well device regions may be doped with a suitable dopant to a concentration of about $5 \times 10^{17}$ to about $5 \times 10^{18}$ cm$^{-3}$, while the $P^+$-type anode region and the $N^+$-type cathode region may be doped with a suitable dopant to a concentration of about $10^{21}$ to about $10^{22}$ cm$^{-3}$. ESD protection device 350 further comprises a first gate 360 overlying first N-well device region 352 and first P-well device region 354 and a second gate 362 overlying second N-well device region 356 and second P-well device region 358. A first gate insulator 364 and a second gate insulator 366 separate gates 360 and 362 from the respective well regions. First spacers 380 are disposed about the sidewalls of first gate 360 and second spacers 382 are disposed about the sidewalls of second gate 362. As evident from FIG. 6, ESD protection device 350 comprises three P-N junctions structures, or three forward-biased diodes, 370, 372, and 374 with two gates. The two gates 360 and 362 may be biased independently. A high positive voltage on one of the gates inverts the P-well region under that gate, removing the diode junction under that gate. When both gates are positively biased, there is only one junction in the device (diode 370), analogous to the high positive gate voltage condition of FIG. 1. Accordingly, ESD protection device 350 provides for even higher turn-on voltage and lower leakage when used for I/O ESD protection or for supply clamping of high voltage supplies. While FIG. 6 illustrates an ESD protection device having four well regions separating the P+ anode region and the N+ cathode region, it will be appreciated that any suitable number of well regions and any suitable number of overlying gates may be used to achieve even higher turn-on voltages.

Accordingly, electrostatic discharge protection device and methods for protecting the input of semiconductor circuits using an electrostatic discharge protection device have been provided. The ESD protection device comprises at least two forward-biased diodes disposed in series. During an ESD event, one of the forward-biased diodes is shorted, thus transmitting the ESD signal to ground. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A device, comprising:
   a silicon-on-insulator substrate comprising: a carrier wafer, an insulating layer overlying the carrier wafer; and a layer of silicon on the insulating layer, wherein layer of silicon includes a first PN junction diode and a second PN junction diode;
   a P+-type anode region disposed within the layer of silicon and extending to the insulating layer;
   a first N-well device region disposed within the layer of silicon and extending to the insulating layer, the first N-well device region in series with the P+-type anode region such that the first PN junction diode is formed between the P+-type anode region and the first N-well device region, wherein the first N-well device region is electrically floating;
   a first P-well device region disposed within the layer of silicon and extending to the insulating layer, the first P-well device region in series with the first N-well device region wherein the first P-well device region is electrically floating;
   an N+-type cathode region disposed within the layer of silicon and extending to the insulating layer, wherein the second PN junction diode is formed between the first P-well device region and the N+-type cathode region;
   a first gate electrode disposed at least substantially overlying the first N-well and P-well device regions of the silicon-on-insulator substrate;
   an input-output pad coupled to the P+-type anode region; and
   an RC-triggered sensing circuit coupled to the gate electrode, wherein the RC-triggered sensing circuit is designed to sense an electrostatic discharge event applied to the input-output pad, and upon sensing the electrostatic discharge event, to communicate a voltage to the gate electrode to invert one of the first N-well device region and the first P-well device region to short out one of the first PN junction diode and the second PN junction diode.

2. The device of claim 1, wherein the N+-type cathode region is disposed in series with the P-well device region.

3. The device of claim 1, wherein the first P-well and N-well device regions are doped to a concentration of about $5 \times 10^{17}$ to about $5 \times 10^{18}$ cm$^{-2}$ and the P+-type anode region and the N+-type cathode region are doped to a concentration of about $10^{21}$ to about $10^{22}$ cm$^{-2}$.

4. The device of claim 1, further comprising a second N-well device region disposed within the silicon-on-insulator substrate in series with the first P-well device region and a second P-well device region disposed within the silicon-on-insulator substrate in series with the second N-well device region.

5. The device of claim 4, further comprising a second gate electrode disposed at least substantially overlying the second N-well and P-well device regions of the silicon-on-insulator substrate.

6. A method for protecting an input of a semiconductor structure from an electrostatic discharge event, the method comprising the steps of:
   providing the semiconductor structure wherein the semiconductor structure comprises: a gate electrode, a first diode and a second diode series-coupled to an input by an input-output pad;
   electrically coupling an RC-triggered sensing circuit to the gate electrode, wherein the RC-triggered sensing circuit is designed to sense an electrostatic discharge event applied to the input-output pad;
   forward biasing the first diode and the second diode; and
   upon sensing the electrostatic discharge event communicating a voltage from the RC-triggered sensing circuit to the gate electrode to cause a device region of one of the first diode and the second diode to be inverted and short out the one of the first diode and the second diode that is inverted.

7. The method of claim 6, wherein the step of providing the semiconductor structure, comprises the steps of:
   providing a silicon-on-insulator substrate comprising: a carrier wafer, an insulating layer overlying the carrier wafer; and a silicon layer on the insulating layer;
   providing a P+-type anode region disposed within the silicon layer and extending to the insulating layer, the P+-type anode region being coupled to the input-output pad;
   disposing a first N-well device region within the silicon layer in series with the P+-type anode region and extending to the insulating layer such that a first PN junction is formed between the P+-type anode region and the first N-well device region;
   disposing a first P-well device region within the silicon layer in series with the first N-well device region and extending to the insulating layer; and
   disposing an N+-type cathode region within the silicon layer and extending to the insulating layer such that a second PN junction is formed between the first P-well device region and the N+-type cathode region.

8. The method of claim 7, wherein the step of communicating a voltage from the RC-triggered sensing circuit to the gate electrode comprises the step of:
   upon sensing the electrostatic discharge event communicating a voltage from the RC-triggered sensing circuit to the gate electrode to cause one of the first N-well device region and the first P-well device region to be inverted and short out the one of the first diode and the second diode that includes the one of the first N-well device region and the first P-well device region that is inverted.

9. The method of claim 7, wherein the gate electrode at least substantially overlies the first N-well and P-well device regions of the silicon layer.

10. The method of claim 6, wherein the RC-triggered sensing circuit has an RC time constant that is longer than an expected rise time of an electrostatic discharge event.

11. The method of claim 6, further comprising the step of providing a third diode series-coupled to the first and second diode and to the input.

12. The method of claim 7,
wherein the first P-well and N-well device regions are doped to a concentration of about $5 \times 10^{17}$ to about $5 \times 10^{18}$ cm$^{-2}$ and the P$^+$-type anode region and the N$^+$-type cathode region are doped to a concentration of about $10^{21}$ to about $10^{22}$ cm$^{-2}$.

13. The method of claim 11, wherein the step of providing a third diode comprises the steps of:
forming a second N-well device region within the silicon layer in series with the first P-well device region and extending to the insulating layer; and
forming a second P-well device region within the silicon layer in series with the second N-well device region and extending to the insulating layer.

14. An apparatus, comprising:
an input-output pad;
a semiconductor structure, comprising:
a P$^+$-type anode region coupled to the input-output pad,
an electrically floating N-well device region in series with the P$^+$-type anode region,
an electrically floating P-well device region in series with the electrically floating N-well device region,
an N$^+$-type cathode region in series with the electrically floating P-well device region, and
a gate electrode overlying the electrically floating N-well device region and the electrically floating P-well device region; and
a sensing circuit electrically coupled to the gate electrode, the sensing circuit designed to sense an electrostatic discharge event applied to the input-output pad, and to communicate a voltage to the gate electrode upon sensing the electrostatic discharge event to cause one of the electrically floating N-well device region and the electrically floating P-well device region to be inverted in response to the electrostatic discharge event.

15. A method for protecting an input of a semiconductor structure from an electrostatic discharge event, the method comprising the steps of:
providing the semiconductor structure, comprising: an input-output pad, a gate electrode, a first diode and a second diode series-coupled to the input by the input-output pad;
electrically coupling a sensing circuit to the gate electrode, wherein the sensing circuit is designed to sense an electrostatic discharge event applied to the input-output pad and to communicating a voltage to the gate electrode upon sensing the electrostatic discharge event;
forward biasing the first diode and the second diode; and
communicating a voltage from the sensing circuit to the gate electrode to cause an electrically floating device region of one of the first diode and the second diode to be inverted upon sensing the electrostatic discharge event.

* * * * *